(12) United States Patent
Moroz

(10) Patent No.: US 8,901,615 B2
(45) Date of Patent: Dec. 2, 2014

(54) N-CHANNEL AND P-CHANNEL END-TO-END FINFET CELL ARCHITECTURE

(75) Inventor: Victor Moroz, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 31 days.

(21) Appl. No.: 13/495,719

(22) Filed: Jun. 13, 2012

(65) Prior Publication Data

US 2013/0334613 A1  Dec. 19, 2013

(51) Int. Cl.
*H01L 27/088*  (2006.01)

(52) U.S. Cl.
USPC ............ 257/207; 257/208; 257/347; 257/401

(58) Field of Classification Search
USPC .................................. 257/207, 208, 347, 401
See application file for complete search history.

(56) References Cited

U.S. PATENT DOCUMENTS

| | | | |
|---|---|---|---|
| 6,252,427 B1 | 6/2001 | Domae et al. | |
| 6,285,088 B1 * | 9/2001 | Madan | 257/202 |
| 7,190,050 B2 * | 3/2007 | King et al. | 257/622 |
| 7,223,650 B2 | 5/2007 | Chang | |
| 7,259,979 B2 * | 8/2007 | Sachan et al. | 365/72 |
| 7,439,153 B2 * | 10/2008 | Tsuboi et al. | 438/404 |
| 7,456,446 B2 | 11/2008 | Tahira et al. | |
| 7,671,422 B2 * | 3/2010 | Wang | 257/369 |
| 7,723,806 B2 * | 5/2010 | Liaw | 257/401 |
| 7,862,962 B2 | 1/2011 | Shieh et al. | |
| 7,955,928 B2 | 6/2011 | Chan et al. | |
| 8,004,042 B2 * | 8/2011 | Yang et al. | 257/368 |
| 8,378,394 B2 | 2/2013 | Anderson et al. | |
| 8,530,959 B2 | 9/2013 | Chang et al. | |
| 8,561,003 B2 * | 10/2013 | Kawa et al. | 716/132 |
| 2008/0042218 A1 * | 2/2008 | Igarashi et al. | 257/391 |
| 2008/0296691 A1 | 12/2008 | Chuang et al. | |
| 2008/0296702 A1 | 12/2008 | Lee et al. | |
| 2010/0127333 A1 * | 5/2010 | Hou et al. | 257/368 |

(Continued)

FOREIGN PATENT DOCUMENTS

JP       2008198647 A       8/2008

OTHER PUBLICATIONS

Hisamoto D., et al., "A Folded-channel MOSFET for Deep sub-tenth Micron Era", IEEE International Electron Device Meeting Technical Digest, Dec. 6-9, 1998, pp. 1032-1034.

(Continued)

*Primary Examiner* — Eugene Lee
(74) *Attorney, Agent, or Firm* — Haynes Beffel & Wolfeld LLP

(57) ABSTRACT

A finFET block architecture uses end-to-end finFET blocks. A first set of semiconductor fins having a first conductivity type and a second set of semiconductor fins having a second conductivity type can be aligned end-to-end. An inter-block isolation structure separates the semiconductor fins in the first and second sets. The ends of the fins in the first set are proximal to a first side of the inter-block isolation structure and ends of the fins in the second set are proximal to a second side of the inter-block isolation structure. A patterned gate conductor layer includes a first gate conductor extending across at least one fin in the first set of semiconductor fins, and a second gate conductor extending across at least one fin in the second set of semiconductor fins. The first and second gate conductors are connected by an inter-block conductor.

13 Claims, 11 Drawing Sheets

(56) References Cited

U.S. PATENT DOCUMENTS

2010/0287518 A1    11/2010   Becker
2011/0133292 A1    6/2011    Lee et al.
2013/0181297 A1*   7/2013    Liaw .............................. 257/390

OTHER PUBLICATIONS

Jan et al., a 32nm SoC platform technology with 2nd generation high-k/metal gate transistors optimized for ultra low power, high performance, and high density product applications, IEEE IEDM Dec. 7-9, 2009, 4 pages.

Lindert N. et al., "Sub-60-nm Quasi-Planar FinFETs Fabricated Using a Simplified Process," IEEE Electron Device Letters, 22, Oct. 2001, pp. 487-489.

International Search Report mailed Nov. 21, 2013 in International Application No. PCT/US2013/045187, 10 pages.

* cited by examiner

N-CHANNEL AND P-CHANNEL END-TO-END FINFET CELL ARCHITECTURE

BACKGROUND

1. Field of the Invention

The present invention relates to integrated circuit devices, cell libraries, cell architectures and electronic design automation tools for integrated circuit devices, including finFET devices.

2. Description of Related Art

FinFET style transistors have been described in D. Hisamoto et al., IEDM, 1998; and N. Lindert et al., IEEE Electron Device Letters, p. 487, 2001. FinFETs have gained acceptance recently as the requirements of low power and compact layout have become more demanding. In CMOS devices, N-channel and P-channel blocks of transistors are placed in proximity, with insulators in between to prevent latch up, cross-talk and other problems.

In the design of integrated circuits, standard functional cell libraries are often utilized. FinFETs have been implemented in block structures having a grid structure, in which fins are laid out in parallel in first direction on a substrate with a narrow pitch, and gates are laid out in an orthogonal direction across the fins. The individual functional cells are formed using sets of complementary n-channel and p-channel transistors having their source, drain and channel in the fins. To form the functional cells, the fins are sometimes cut in segments to isolate one functional cell from another. This cutting of the fins results in some transistors in the functional cells located on the ends of the fins, and others located inside the fins, away from the ends. Differences in structure that result from location on the fins, can have an effect on the characteristics of the transistors in the functional cells. For example, the stress in the channels of finFET transistors has an impact on transistor performance. So, stressors are used to induce desired levels of stress. However the stress in the channels of the transistors on the ends of fins, i.e. in the locations at which the fins are cut can be different than the stress in the channel of transistors located away from the ends. This variation in transistor performance complicates integrated circuit design.

It is desirable to provide a finFET-based design architecture suitable for implementation of functional cells for a standard functional cell library, and for implementation of integrated circuits using finFET architectures, with flexible layout features while minimizing variations in performance of the transistors.

SUMMARY

An integrated circuit is described using end-to-end finFET blocks. The integrated circuit includes a substrate, with a first set of semiconductor fins aligned in a first direction on the substrate, the first set configured for one of n-channel and p-channel finFETs, and a second set of semiconductor fins configured for the other of n-channel and p-channel finFETs, can be aligned end-to-end on the substrate. An inter-block isolation structure on the substrate, having a first side and a second side, separates the semiconductor fins in the first and second sets. The ends of the fins in the first set are proximal to the first side of the inter-block isolation structure and ends of the fins in the second set are proximal to the second side of the inter-block isolation structure. A patterned gate conductor layer including a first gate conductor extending across at least one fin in the first set of semiconductor fins, and a second gate conductor extending across at least one fin in the second set of semiconductor fins.

FinFET block structures suitable for implementation of a wide variety of functional cells, and creation of finFET standard functional cell libraries for use in integrated circuit design are described. Technology is described for deploying design tools for use of finFET block architectures for integrated circuit design, and as components of electronic design automation software and systems. Integrated circuits including functional cells comprising finFET blocks are described.

DETAILED DESCRIPTION

Figure 1:
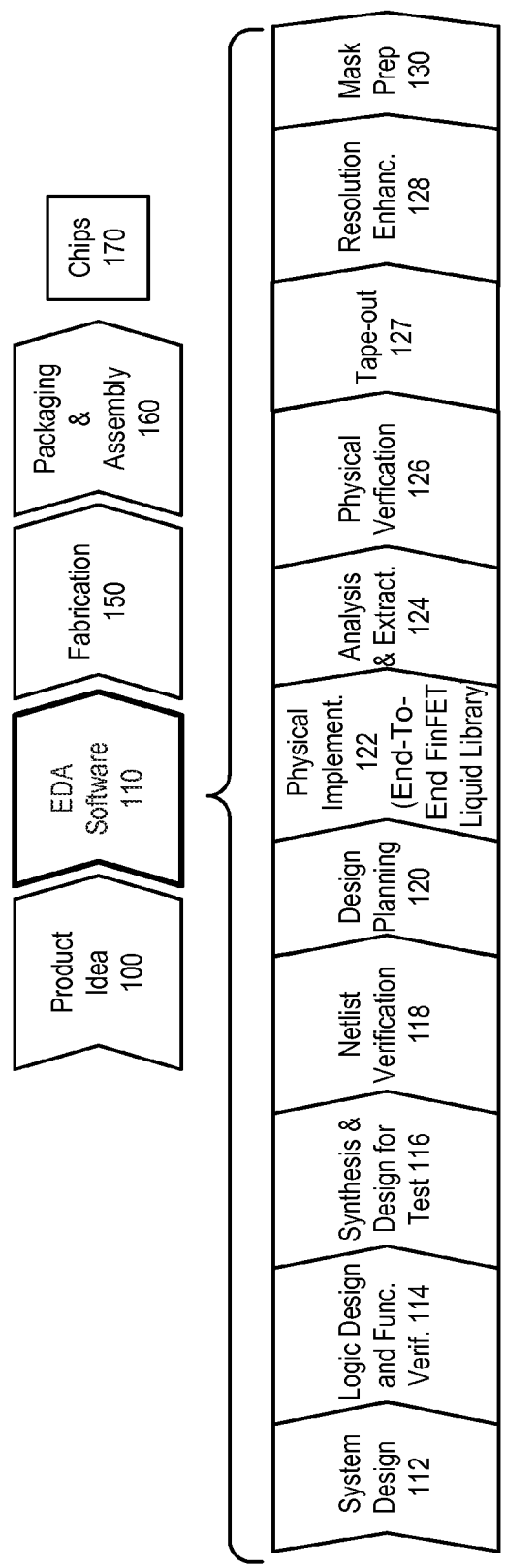
FIG. 1 shows a simplified representation of an illustrative integrated circuit design flow.

FIG. 1 is a simplified representation of an integrated circuit design flow. As with all flowcharts herein, it will be appreciated that many of the steps of FIG. 1 can be combined, performed in parallel or performed in a different sequence without affecting the functions achieved. In some cases a rearrangement of steps will achieve the same results only if certain other changes are made as well, and in other cases a rearrangement of steps will achieve the same results only if certain conditions are satisfied.

At a high level, the process of FIG. 1 starts with the product idea (block 100) and is realized in an EDA (Electronic Design Automation) software design process (block 110). When the design is finalized, the fabrication process (block 150) and packaging and assembly processes (block 160) occur, ultimately resulting in finished integrated circuit chips (result 170).

The EDA software design process (block 110) is actually composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the component steps of the EDA software design process (block 110) will now be provided.

System design (block 112): The designers describe the functionality that they want to implement; they can perform what-if planning to refine functionality; check costs; etc. Hardware-software architecture selection can occur at this stage. Example EDA software products that have been available from Synopsys, Inc. that could be used at this step include Model Architect, Saber, System Studio, and DesignWare® products.

Logic design and functional verification (block 114): At this stage, high level description language (HDL) code, such as the VHDL or Verilog code, for modules in the system is written and the design is checked for functional accuracy. More specifically, the design is checked to ensure that it produces the correct outputs in response to particular input stimuli. Example EDA software products that have been available from Synopsys, Inc. that could be used at this step include VCS, VERA, DesignWare®, Magellan, Formality, ESP and LEDA products.

Synthesis and design for test (block 116): Here, the VHDL/Verilog is translated to a netlist. The netlist can be optimized for the target technology. Additionally, the design and implementation of tests to permit checking of the finished chip occur. Example EDA software products that have been available from Synopsys, Inc. that could be used at this step include Design Compiler®, Physical Compiler, Test Compiler, Power Complier, FPGA Compiler, TetraMAX, and DesignWare® products. Optimization of design for use of end-to-end finFET blocks as described below can occur in this stage.

Netlist verification (block 118): At this step, the netlist is checked for compliance with timing constraints and for correspondence with the VHDL/Verilog source code. Example EDA software products that have been available from Synopsys, Inc. that could be used at this step include Formality, PrimeTime, and VCS products.

Design planning (block 120): Here, an overall floor plan for the chip is constructed and analyzed for timing and top-level routing. Example EDA software products that have been available from Synopsys, Inc. that could be used at this step include Astro and IC Compiler products. End-to-end finFET block functional cell selection, layout and optimization can occur at this stage.

Physical implementation (block 122): The placement (positioning of circuit elements) and routing (connection of the same) occurs at this step. Example EDA software products that have been available from Synopsys, Inc. that could be used at this step include AstroRail, Primetime, and Star RC/XT products. End-to-end finFET block functional cell layout, mapping and interconnect arrangements can be implemented or optimized at this stage, using for example end-to-end finFET standard functional cells based on end-to-end finFET block functional cell layouts described herein.

Analysis and extraction (block 124): At this step, the circuit function is verified at a transistor level; this in turn permits what-if refinement. Example EDA software products that have been available from Synopsys, Inc. that could be used at this stage include Custom Designer, AstroRail, PrimeRail, Primetime, and Star RC/XT products.

Physical verification (block 126): At this stage various checking functions are performed to ensure correctness for: manufacturing, electrical issues, lithographic issues, and circuitry. Example EDA software products that have been available from Synopsys, Inc. that could be used at this stage include the Hercules product.

Tape-out (block 127): This stage provides the "tape-out" data for production of masks for lithographic use to produce finished chips. Example EDA software products that have been available from Synopsys, Inc. that could be used at this stage include the CATS® family of products.

Resolution enhancement (block 128): This stage involves geometric manipulations of the layout to improve manufacturability of the design. Example EDA software products that have been available from Synopsys, Inc. that could be used at this stage include Proteus/Progen, ProteusAF, and PSMGen products.

Mask preparation (block 130): This stage includes both mask data preparation and the writing of the masks themselves. Example EDA software products that have been available from Synopsys, Inc. that could be used at this stage include CATS® family of products.

Embodiments of the end-to-end finFET block-based technology described herein can be used during one or more of the above-described stages, including for example one or more of stages 116 through 122 and 130. Also, end-to-end finFET block technology provides flexibility that enables the implementation of engineering change orders ECOs, including modification of the functional cell sizes during design verification stages.

Figure 2A:
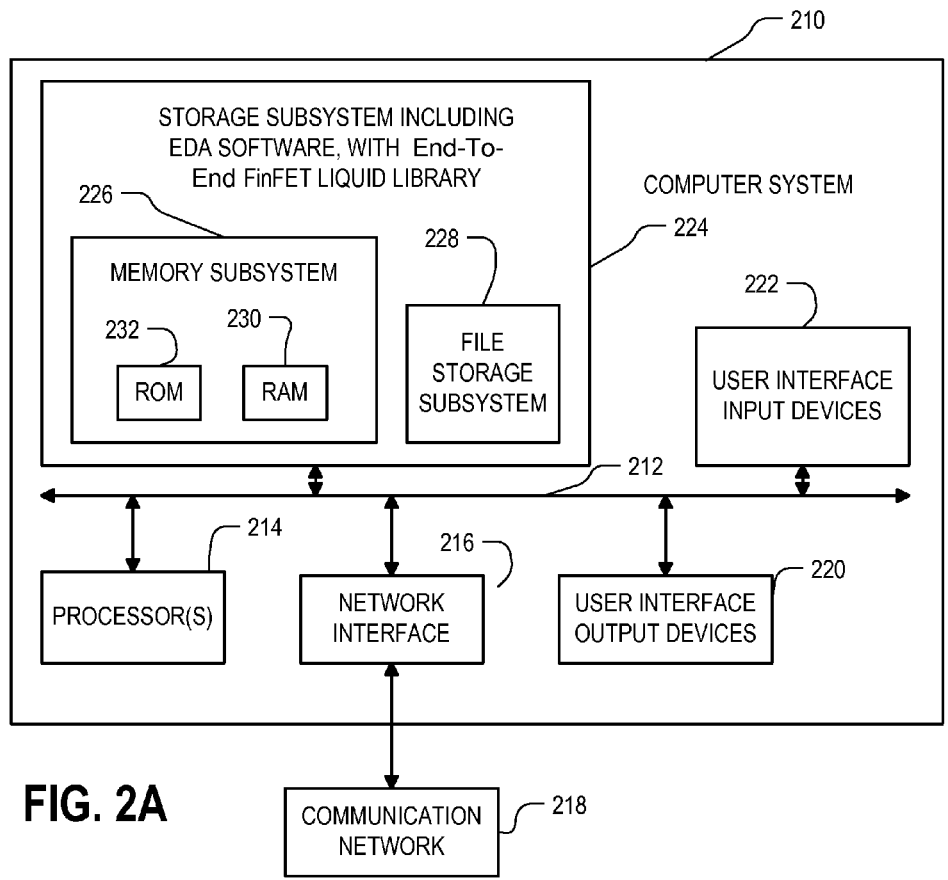
FIGS. 2A, 2B and 2C are simplified block diagrams of a computer system suitable for use with embodiments of the technology, as well as circuit design and circuit embodiments of the technology.

FIG. 2A is a simplified block diagram of a computer system 210 suitable for use with embodiments of the technology. Computer system 210 typically includes at least one processor 214 which communicates with a number of peripheral devices via bus subsystem 212. These peripheral devices may include a storage subsystem 224, comprising a memory subsystem 226 and a file storage subsystem 228, user interface input devices 222, user interface output devices 220, and a network interface subsystem 216. The input and output devices allow user interaction with computer system 210. Network interface subsystem 216 provides an interface to outside networks, including an interface to communication network 218, and is coupled via communication network 218 to corresponding interface devices in other computer systems. Communication network 218 may comprise many interconnected computer systems and communication links. These communication links may be wireline links, optical links, wireless links, or any other mechanisms for communication of information. While in one embodiment, communication network 218 is the Internet, communication network 218 may be any suitable computer network.

User interface input devices 222 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 210 or onto communication network 218.

User interface output devices 220 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 210 to the user or to another machine or computer system.

Storage subsystem 224 stores the basic programming and data constructs that provide the functionality of some or all of the EDA tools described herein, including the end-to-end finFET flexible library and tools applied for development of functional cells for the library and for physical and logical design using the library. These software modules are generally executed by processor 214.

Memory subsystem 226 typically includes a number of memories including a main random access memory (RAM) 230 for storage of instructions and data during program execution and a read only memory (ROM) 232 in which fixed instructions are stored. File storage subsystem 228 provides persistent storage for program and data files, and may include a hard disk drive, a floppy disk drive along with associated removable media, a CD-ROM drive, an optical drive, or removable media cartridges. The databases and modules implementing the functionality of certain embodiments may be stored by file storage subsystem 228.

Bus subsystem 212 provides a mechanism for letting the various components and subsystems of computer system 210 communicate with each other as intended. Although bus subsystem 212 is shown schematically as a single bus, alternative embodiments of the bus subsystem may use multiple busses.

Computer system 210 itself can be of varying types including a personal computer, a portable computer, a workstation, a computer terminal, a network computer, a television, a mainframe, or any other data processing system or user device. Due to the ever-changing nature of computers and networks, the description of computer system 210 depicted in FIG. 2A is intended only as a specific example for purposes of illustrating the preferred embodiments. Many other configurations of computer system 210 are possible having more or less components than the computer system depicted in FIG. 2A.

Figure 2B:
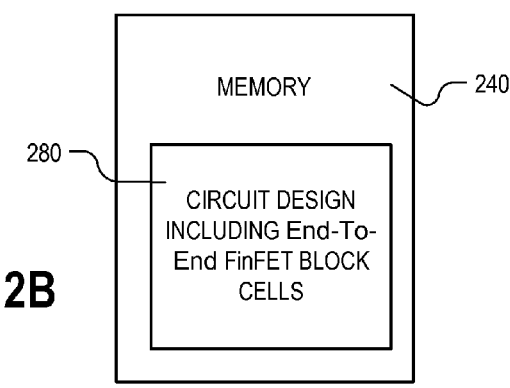
Figure 2C:
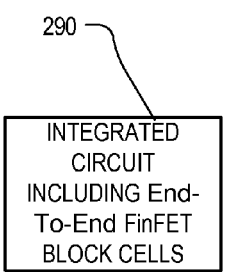

FIG. 2B shows a memory 240 such as a non-transitory, computer readable data storage medium associated with file storage subsystem 228, and/or with network interface subsystem 216 can include a data structure specifying a circuit design that includes functional cells from the end-to-end finFET flexible library, or other end-to-end finFET block-based functional cells as described in detail below. In other embodiments, the memory 240 stores a functional cell library that includes functional cells implemented using a flexible end-to-end finFET block structure. The memory 240 can be a hard disk, a floppy disk, a CD-ROM, an optical medium, removable media cartridge, or other medium that stores computer readable data in a volatile or non-volatile form. The memory 240 is shown storing a circuit design 280, including for example an HDL description of a circuit design, that includes one or more finFET block functional cells created with the described end-to-end finFET technology. FIG. 2C is a block representing an integrated circuit 290 created with the described technology that includes one or more end-to-end finFET block functional cells, and/or functional cells selected from a finFET flexible library.

Figure 3A:
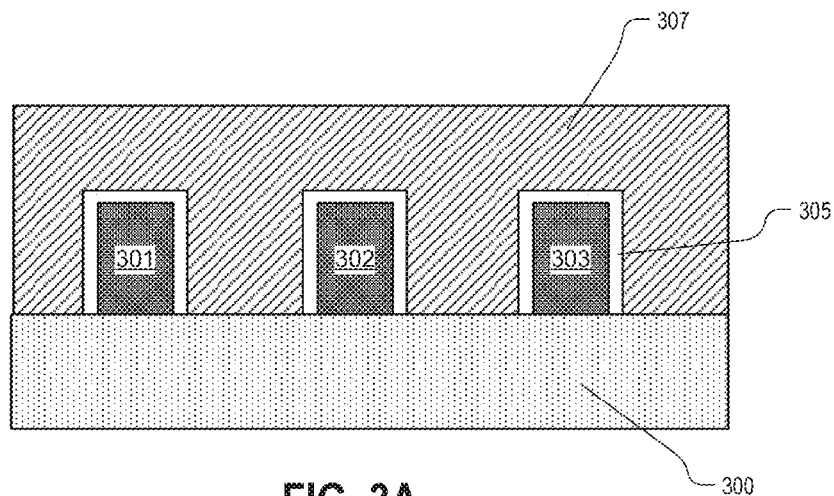
FIGS. 3A and 3B are simplified diagrams showing finFET structures known in the prior art.
Figure 3B:
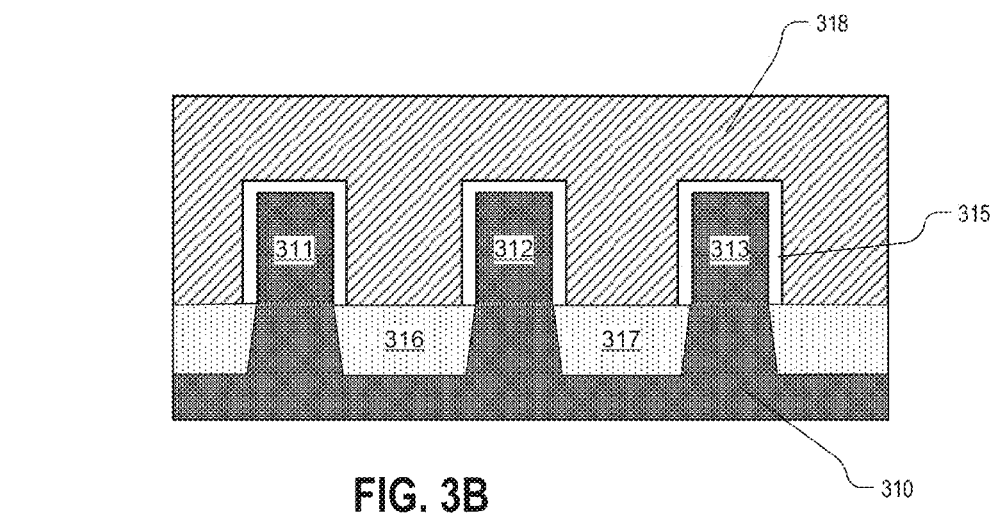

FIGS. 3A and 3B are simplified illustrations showing finFET structures in typical silicon-on-insulator and bulk substrate configurations, respectively. Both of these basic structures can be used in the end-to-end finFET block functional cells described herein.

In FIG. 3A, a plurality of fins 301, 302, 303 is disposed on an insulating substrate 300. The insulating substrate 300 could comprise a layer of insulating material on a bulk semiconductor substrate, such as is employed in silicon-on-insulator integrated circuits, or could comprise a bulk dielectric substrate material such as sapphire. The fins 301, 302, 303 comprise semiconductor bodies arranged in parallel on the substrate 300, so that they extend into and out of page in FIG. 3A. A gate dielectric layer 305 overlies the sides and usually the tops of the fins 301, 302, 303. A gate conductor 307, which can be implemented using metal or polysilicon for example, extends across the fins and over the gate dielectric layer 305.

FIG. 3B shows a plurality of fins 311, 312, 313 which protrude from a bulk semiconductor body 310, sometimes referred to as body-tied fins. In addition, the individual fins are separated by shallow trench isolation structures 316, 317. A gate dielectric layer 315 overlies the fins, 311, 312, 313. A gate conductor 318 extends across the fins and over the gate dielectric layer 315.

For the embodiments of FIG. 3A and FIG. 3B, on either side of the gate conductor 307, 318, source and drain regions (not shown) are implemented in the fins. The FET transistors that result have source, channel and drain regions in the fins, and a gate overlying the fins. Such transistors are often called multi-gate transistors, because the gate conductor overlies two sides of the fins, and as a result increases the effective width of the channel. The fins used to implement the finFET transistors can be quite narrow. For example, fins having widths on the order of 20 nm or less can be utilized. As a result of the multi-gate gate structure and the narrow widths of the fins, finFET transistors have excellent performance characteristics and small layout areas.

Figure 4:
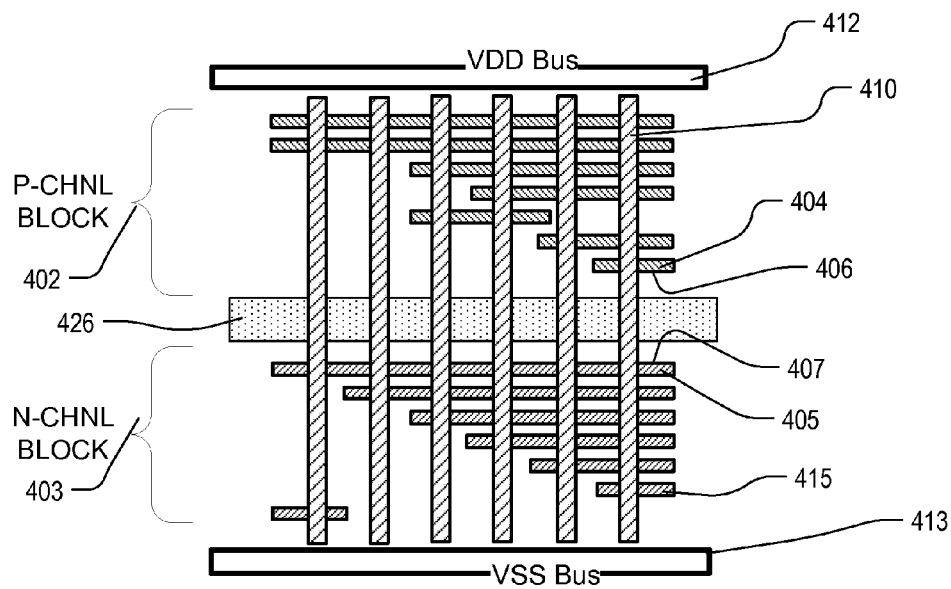
FIG. 4 is a simplified layout diagram of complementary, side-to-side finFET blocks suitable for use in the standard functional cell library.
Figure 4A:
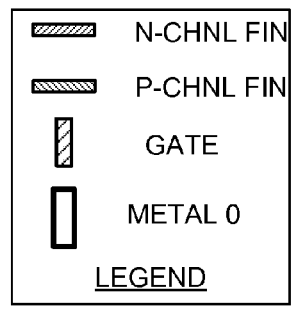
FIG. 4A is a legend applicable to FIGS. 4 and 5.

FIG. 4 illustrates complementary, side-to-side finFET blocks in which finFET transistors (and other semiconductor devices) can be arranged to implement functional cells of a flexible finFET functional cell library. FIG. 4A is a legend, applicable to FIG. 4 and FIG. 5, that shows the shading for components of the finFET blocks including the shading for n-channel and p-channel semiconductor fins, the shading for a gate conductor, and the shading for a first metal layer (metal-0).

The layout in FIG. 4 illustrates a repeatable pattern of side-to-side finFET blocks, suitable for implementation of functional cells using complementary p-channel and n-channel transistors, known as CMOS transistors. The pattern includes a p-channel block 402, and an n-channel block 403. Isolation structure 426 separates the p-channel block 402 from the n-channel block 403. The p-channel block 402 includes area allocated for a set of fins, including fin 404, to be laid out in parallel on the substrate. The set of fins in the p-channel block 402 shown in the illustration includes seven members when all the allocated area is utilized. The number of members in the set of fins for which area is allocated in any given finFET block can vary according to the needs of a particular implementation. The fins can be implemented on an insulating layer, or protrude from an underlying semiconductor body (not shown), as discussed above.

The n-channel block 403 includes a set of fins, including fin 405, the members of which are laid out in parallel on the substrate. The set of fins in the re-channel block 403 shown in the illustration includes seven members when all the allocated area is utilized. Although the drawings herein show that the n-channel blocks and the p-channel blocks have area allocated for equal numbers of fins, implementations of the technology can use different numbers of fins in the various blocks. The number of members in the set of fins for which area is allocated in any given finFET block can vary according to the needs of a particular implementation. As with the p-channel block, the fins in the n-channel block can be implemented on an insulating layer, or protrude from an underlying semiconductor body (not shown), as discussed above.

As illustrated, the block layout of FIG. 4 shows side-to-side finFET layout, where fins 404 and 405 proximal to the opposing sides of isolation structure 426 have parallel sides 406 and 407, respectively, which are adjacent to the isolation structure 426.

A patterned gate conductor layer overlies the fins, and includes gate conductors (shown with "gate" shading) in the plurality of finFET blocks shown in the diagram arranged along columns. The number of columns can be selected as suits a particular implementation. The p-channel block 402 includes gate conductors, including gate conductor 410, which are elements of the patterned gate conductor layer, and are disposed over and orthogonal to the set of fins in the blocks 402 and 403, and extend across the isolation structure 426. In alternative embodiments, the gate conductor 410 can be implemented using separate conductors in each block, which can be connected using patterned metal layers in overlying layers.

The isolation structure 426 is positioned between the p-channel block 402 and the n-channel block 403. The isolation structure 426 can be used to prevent current leakage as a result of parasitic transistors and the like which may otherwise result from the CMOS functional cell layout. In one example, the isolation structure 426 is an insulator filled trench, in a semiconductor substrate, the width and/or the depth of which can be the same as, or greater than, the widths or depths of the trenches between the fins within the blocks of fins. In some embodiments, the isolation structure can include components that are designed to reduce or balance stress on the sides 406 and 407 of the fins proximate to the isolation structure.

In this example, a patterned conductor layer (metal-0) is laid out with the patterned gate conductor layer that includes the gate conductors (e.g. 410). Metal-0 conductors 412, 413 can be power conductors used to connect selected fins to power (VDD) and ground (VSS) rails. In alternative structures, VDD and VSS power conductors can be implemented using higher layer (e.g. metal-1 or metal 2) conductors, and can be connected in turn to metal-0 conductors 412 and 413 in a standard functional cell layout.

A power conductor, or a power rail, as used herein is a conductive conductor in a patterned conductor layer that is used primarily to deliver power supply voltages, commonly referred to as VDD or VSS, to the elements of a circuit. The VDD voltage and the VSS voltage for a given block may be the same as or different from the VDD voltage and the VSS voltage for another block, or for other circuits on the same integrated circuit.

At least one patterned conductor layer (metal-1, metal 2, etc.) overlies the patterned gate conductor layer in embodiments of the technology described here. In FIG. 4, these patterned conductor layers are omitted for ease of illustration of the basic side-to-side layout for finFET blocks. The conductors in the first patterned conductor layer can be advantageously arranged parallel to the gate conductors in the patterned gate conductor layer, and orthogonal to the fins. This facilitates the use of the first patterned conductor layer for interconnecting gate conductors and source/drain regions along columns in the adjacent blocks.

The finFET blocks can be arranged on a grid pattern, where grid pattern has grid cells that are sized to accommodate the horizontal and vertical contact pitches for the integrated circuit technology being applied, where the contact pitch provides room in the layout for interlayer connectors between the gate conductors or the fins, and overlying patterned conductor layers. In a representative grid pattern, the gate conductors are arranged in parallel and spaced apart so that one gate conductor falls within each grid cell, allowing room for the horizontal pitch of interlayer connectors to contact each gate conductor. Also, the fins are arranged in parallel and spaced apart so that one finFET falls within each grid cell, allowing room for the vertical pitch of interlayer connectors to contact each gate conductor. The metal-0 connectors that are connected to fins between gate conductors can be formed between gate conductors in some embodiments without increasing the horizontal pitch requirements, as shown in the figure. In some implementations, the horizontal and vertical pitches for the grid cells can be different, and defined using the layout specifications for particular manufacturing technologies and layout architectures.

Figure 5:
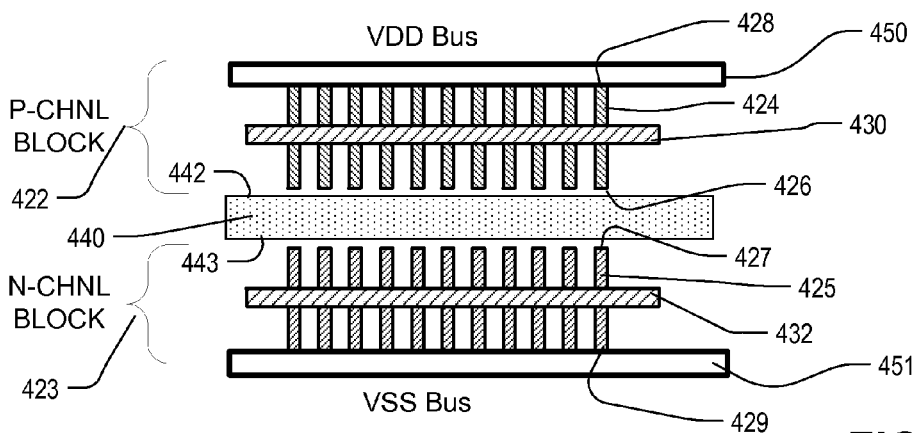
FIG. 5 is a simplified layout diagram of complementary, end-to-end finFET blocks suitable for use in the standard functional cell library.

FIG. 5 illustrates complementary, end-to-end finFET blocks in which finFET transistors (and other semiconductor devices) can be arranged to implement functional cells of a flexible finFET functional cell library, in contrast to the side-to-side finFET blocks of FIG. 4. The legend in FIG. 4A is applicable to the layout drawing in FIG. 5.

The layout in FIG. 5 illustrates a repeatable pattern of end-to-end finFET blocks, suitable for implementation of functional cells using complementary p-channel and n-channel finFET transistors, known as CMOS finFET transistors. The pattern includes a p-channel block 422 and an n-channel block 423. Isolation structure 440 having opposing first and second sides 442, 443, separates the p-channel block 422 and the n-channel block 423. The p-channel block 422 includes a set of fins, including fin 424, the members of which are laid out in parallel on the substrate. The n-channel block 423 includes a set of fins, including fin 425, the members of which are laid out in parallel on the substrate. The fins in the n-channel block 423 and in the p-channel block 422 are arranged end-to-end. Thus, for example, fin 424 in the p-channel block 422 has a first end 426 and a second end 428. The first end is adjacent to, or proximal to, a first side 442 of the inter-block isolation structure 440. The fin 424 extends away from the inter-block isolation structure 440 in a first direction, so that the second end 428 is distal to the inter-block isolation structure 440. The fin 425 in the n-channel block 423 has a first end 427 and a second end 429. The first end 427 is adjacent to, or proximal to, a second side 443 of the inter-block isolation structure 440. The fin 424 extends away from the inter-block isolation structure 440 in a first direction, so that the second end 428 is distal to the inter-block isolation structure 440.

The set of fins in the p-channel block 422 shown in the illustration includes 11 members. The number of members in the set of fins making up a given finFET block can vary according to the needs of particular implementation. The fins can be implemented on an insulating layer, or protrude from an underlying semiconductor body (not shown), as discussed above.

The set of fins in the n-channel block 423 shown in the illustration includes 11 members, which is the same as the number for the p-channel block 422. Although the drawings herein show that the n-channel block 423 and the p-channel block 422 have equal numbers of fins, implementations of the technology can use different numbers of fins in the various blocks. The fins can be implemented on an insulating layer, or protrude from an underlying semiconductor body (not shown), as discussed above.

In this example, a patterned conductor layer (metal-0) is laid out with the patterned gate conductor layer that includes the gate conductors (e.g. 430, 432). Metal-0 conductors 450, 451 can be used to connect selected fins to VDD and VSS power conductors in other layers of the device, which can be connected in turn to metal-0 conductors 450 and 451 in a standard functional cell layout. In alternative structures, VDD and VSS power conductors can be implemented using higher layer (e.g. metal-1 or metal 2) conductors.

FinFET structures are desirable because of the improved transistor performance that can be achieved within a given layout area. FinFET block designs take advantage of the finFET structure to create functional cells that have a "quantized" performance, which can be controlled by connecting and disconnecting fins from a functional cell to change the effective channel widths, and therefore transistor strengths, for finFETs in the logic design. However, issues that can arise in the design of side-by-side blocks as illustrated in FIG. 4 because of the asymmetric stress induced on the fins on the edges of the blocks. The asymmetric stress causes structural warping and cracking failures during manufacture, and performance variations across the array. These problems become more pronounced as the fin widths shrink below 20 nm. Further reductions in width begin to create problems with mechanical stability of the fins, particularly when the isolation width or depth is different on the two sides of the fin. For example, referring to FIG. 4, fin 404 has a narrow isolation structure above it, but a much wider isolation structure 426 below it, towards fin 405. Due to the inherent stresses in the isolation materials, such as HDP oxide (High Density Plasma Chemical Vapor Deposition CVD process), or SOG oxide (Spin-On-Glass), or flowable CVD oxide (CVD process with flowable material), the isolation structures with different widths and/or depths impose different forces on the two sides of fin 404. A large force imbalance may cause dislocation formation or cracking of the fin 404, making the transistors non-functional.

Also, as illustrated in FIG. 4, the semiconductor fins in the side-by-side blocks are often implemented to have different numbers of finFETs per line. Thus, the blocks can include longer semiconductor fins, like fin 405, and shorter semiconductor fins, like fin 415. Longer fins (like 405) can have better performance due to the possibility of stronger or more uniform stress engineering there, but the transistors in the shorter fins (like fin 415) can have weaker performance due to the possibility of stress relaxation there.

The block layout in FIG. 5 shows an end-to-end finFET layout, where fins 424 and 425 have respective ends proximal to corresponding sides 442, 443 of the isolation structure 440. In the layout illustrated in FIG. 5, the set of fins in the p-channel block 422 are aligned end-to-end with the set of fins in the n-channel block 423, so that the outside sides of the fins 424 and 425 are aligned with one another. In alternative implementations, the fins in the p-channel block 422 can be offset relative to fins in the set of fins in the n-channel block 423, so that the outside sides of the fins 424 and 425 may be offset yet arranged end-to-end and extending in the same direction.

End-to-end layouts substantially reduce the problems mentioned above that arise using the side-to-side block layout. For example, the end of a fin (e.g. end 426 of fin 424) might encounter asymmetric stress proximal to the inter-block isolation structure, as compared to stress from power conductor structures on the distal end. However, the ends of the fins are structurally suited to absorb the stress without impacting the structural integrity of the fin, without causing warping, and without causing significant variations in stress on the channels of the finFETs in the block. Also, stressor structures as illustrated below can be formed on the ends of the fins, or between the ends of the fins and the gate conductors. Furthermore, the fins aligned end-to-end like on FIG. 5 can be all of the same length, which means that they can all have nominally the same amount of stress and therefore they all have nominally the same performance. This eliminates the strong stress proximity effects that are inherent in the side-to-side fin placement like the one shown on FIG. 4 due to the different fin lengths.

In the layout of FIG. 5, a patterned gate conductor layer includes a first gate conductor 430 over the p-channel block 422, and a second gate conductor 432 over the n-channel block 423. The first gate conductor extends over at least one of the fins (e.g. fin 424) in the p-channel block 422. In this example, first gate conductor 430 is shown extending over all of the fins. Likewise, the second gate conductor 432 extends over at least one of the fins (e.g. fin 425) in the n-channel block 423.

FIG. 5 shows end-to-end blocks that include only one gate conductor (e.g. horizontal conductors 430, 432), in contrast to the side-to-side blocks shown in FIG. 4 which include multiple gates conductors in each block (e.g. vertical conductors like conductor 410). In other embodiments, there can be more than one horizontal gate conductor in an end-to-end block. However, in the end-to-end block arrangement described herein, advantageous embodiments use a single gate conductor in each block and multiple end-to-end fins.

Figure 6:
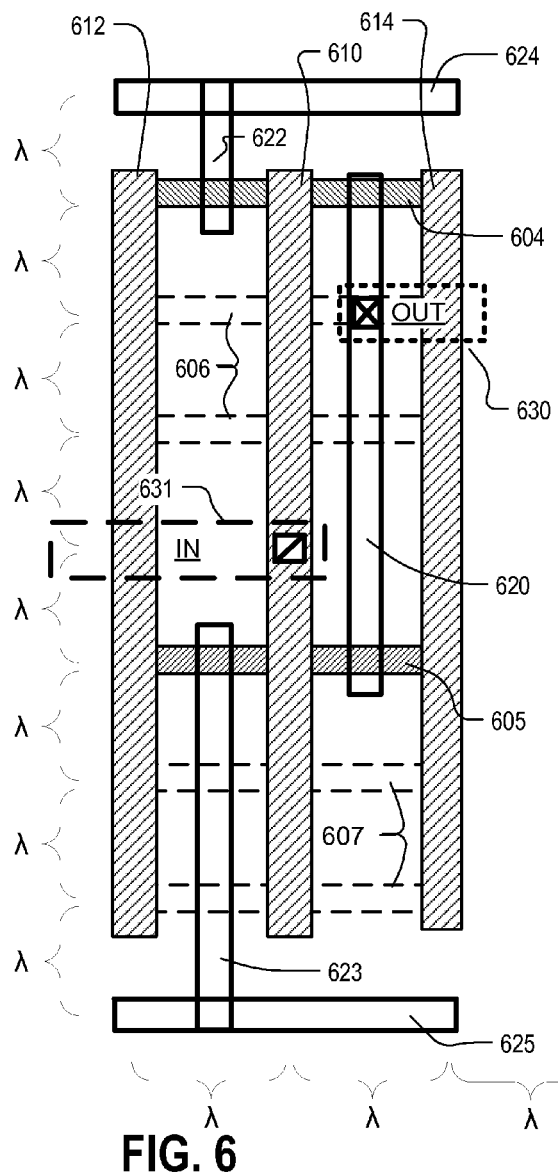
FIG. 6 is a layout diagram of a 1x inverter laid out on side-to-side finFET blocks.

FIG. 6 illustrates a 1x-inverter that comprises a single pull-up transistor in the p-channel block and a single pull-down transistor in the n-channel block laid out in a side-to-side finFET block. The inverter shown in FIG. 6, uses only one transistor in each block, each transistor having a width equal to one times the width of a fin, and can be referred to therefore as a 1x-inverter.

Figure 6A:
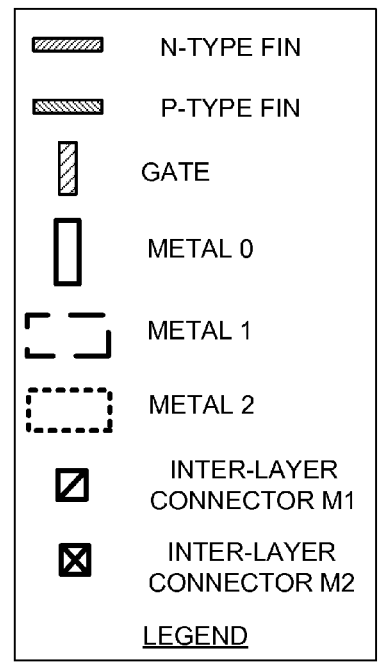
FIG. 6A is a legend applicable to FIGS. 6, 7, 8 and 9.

FIG. 6A is a legend, applicable to FIG. 6, FIG. 7, FIG. 8 and FIG. 9, that shows the shading for components of the finFET blocks including the shading for n-channel and p-channel semiconductor fins, the shading for a gate conductor, and the shading for a first metal layer (metal-0), a second metal layer (metal-1), and a third metal layer (metal-2). The metal-1 and metal-2 layers are patterned conductor layers that overlie the patterned gate conductor layer. The metal-0 layer is beneath the metal-1 and metal-2 layers, and can lie in the same layer of the integrated circuit as the patterned gate conductor layer. The metal-0 layer can make direct contact to source/drain regions on the fins and direct contact to gate conductors. Also, the symbols for two types of interlayer connectors, such as vias, interconnecting the layers are represented in the figure. Interlayer connectors represented by a square with a single cross line from the lower left corner to the upper right corner connect the conductors in the first patterned conductor layer (metal-1) to source/drain regions on the fins. Interlayer connectors represented by a square with an "X" pattern of crossed lines, connect the conductors in the second patterned conductor layer (metal 2) to conductors in a lower patterned conductor layer (e.g., metal-0) or a patterned gate conductor layer. Of course, in many integrated circuit technologies which can be used to implement the end-to-end finFET technologies described herein, more than three patterned conductor layers can be utilized.

The pull-up transistor in the p-channel block is laid out using a single fin 604 having a drain terminal coupled to a metal-0 conductor 620 and a source terminal coupled to metal-0 conductor 622. The metal-0 conductor 620 is connected to a metal 2 conductor 630, at which the output signal of the inverter is supplied. The metal-0 conductor 622 is connected to the metal-0 conductor 624, which is in turn coupled to a VDD power conductor. The pull-down transistor in the n-channel block is laid out using a single fin 605, having a drain terminal coupled to the metal-0 conductor 620, and a source terminal coupled to the metal-0 conductor 623. The metal-0 conductor 623 is connected to the metal-0 conductor 625, which is in turn coupled to a VSS power conductor. The patterned gate connector layer includes gate conductor 610 which extends across fin 604 and across the fin 605. The gate conductor 610 which extends across the p-channel block and the n-channel block in this layout, is connected to a metal-1 connector 631, at which the input to the inverter is supplied. Gate conductors 612 and 614 are "dummy gates," which can be used in block layouts for a variety of reasons. Because of the use of the metal-0 conductors 622, 623 and 620, the pitch associated with these gate conductors is included in the area for the grid cell.

In this example, the n-channel block and the p-channel block are configured for three fins each as represented by the region 606 in the p-channel block and the region 607 in the n-channel block, to facilitate implementation of up to three parallel finFET transistors. However, the 1x-inverter uses only one fin in each block; the area used in the standard block layout for these two additional fins is unused. Nonetheless, the total area for the layout of a 1x-inverter using side-to-side blocks as illustrated can be represented by the count of vertical pitches, where one contact pitch is represented by the symbol "λ," times the count of horizontal pitches, also represented by "λ." As can be seen, assuming the inter-block isolation structure does not consume more than one contact pitch, there are eight vertical contact pitches and three horizontal contact pitches needed to implement the 1x-inverter. The total area is therefore 8 by 3 contact pitches, or $24\lambda^2$.

Figure 7:
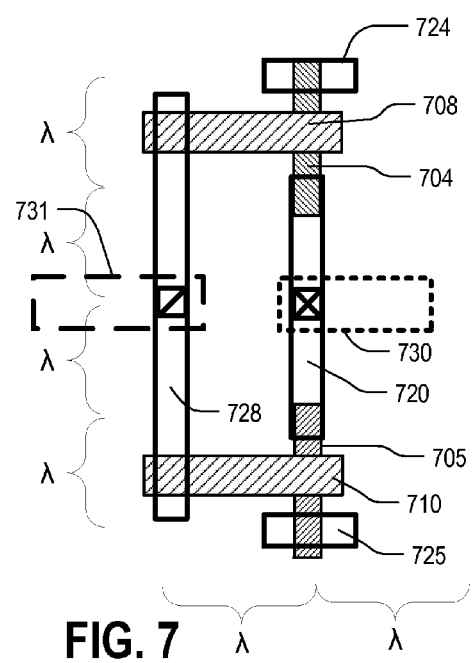
FIG. 7 is a layout diagram of a 1x inverter laid out on end-to-end finFET blocks.

FIG. 7 illustrates a 1x inverter layout in an end-to-end finFET block, in contrast to the side-to-side layout of FIG. 6. The pull-up transistor in the p-channel block is laid out using fin 704 having a source terminal coupled to the metal-0 conductor 724, and a drain terminal coupled to the metal-0 conductor 720. The metal-0 conductor 720 is connected to a metal 2 v 730, at which the output signal of the inverter is supplied. The metal-0 conductor 724 is connected to a VDD power conductor, which can be routed through other patterned conductor layers. The pull-down transistor in the n-channel block is laid out using the fin 705, having a drain terminal coupled to the metal-0 conductor 720, and a source terminal coupled to the metal-0 conductor 725. The metal-0 conductor 725 is connected to a VSS power conductor. The patterned gate connector layer includes gate conductor 708 in the p-channel block, and a gate conductor 710 in the n-channel block. The gate conductor 708 and the gate conductor 710 are arranged in parallel, and cross over the fins 704 in 705, respectively. The metal-0 conductor 728 is connected from the gate conductor 708 to the gate conductor 710. The metal-0 conductor 728 is connected to a metal-1 conductor 731, at which the input to the inverter is supplied. Thus, metal-0 conductor 728 is an embodiment of an inter-block conductor parallel to, and adjacent to, one of the semiconductor fins in the first set and one of the semiconductor fins in the second set, where the inter-block conductor connects the first gate conductor to the second gate conductor. Metal-0 conductor 728 can overlie end-to-end semiconductor fins in the first and second sets of semiconductor fins included in the p-channel and n-channel blocks, and consume the pitch of a single semiconductor fin in the layout. Alternatively, the metal-0 conductor can be placed in area allocated in the grid pattern for metal-0 inter-block conductors, and in which semiconductor fins are not present.

The 1x inverter shown in FIG. 7 is laid out using end-to-end finFET blocks which can be laid out in a much smaller area than that of the inverter of FIG. 7, which is laid out using side-to-side finFET blocks. As illustrated, the inverter of FIG. 7 includes four contact pitches in the vertical direction and two contact pitches in the horizontal direction, for a total area of 4×2 contact pitches, or $8\lambda^2$, or 8 grid cells. This example shows that the end-to-end finFET block layout can be used to implement 1x-inverters using one third of the layout area of a side-to-side finFET block layout, based on three parallel fins in each block.

The layout of one finFET transistor in each block per fin as shown in FIG. 7 can result in a finFET block that has a fin pitch (alternatively referred to as a block pitch) on the y-axis, that is equal to twice the contact pitch λ. Thus, the one-transistor configuration of the end-to-end architecture can fit in a layout grid with per-vertical block pitch of 2λ, assuming that the inter-block isolation structure can be implemented within a single contact pitch λ.

Figure 8:
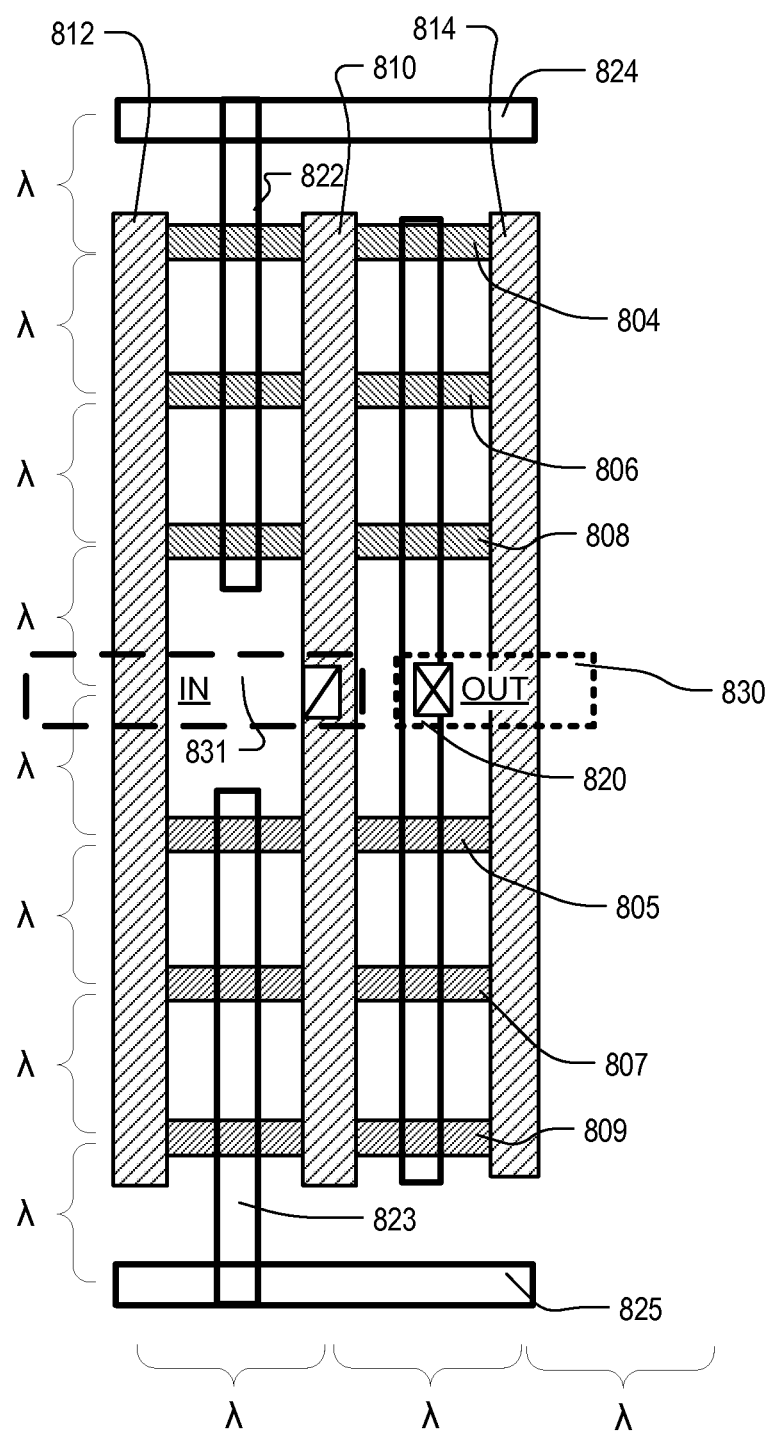
FIG. 8 is a layout diagram of a 3x inverter laid out on side-to-side finFET blocks.

FIG. 8 illustrates the layout of a 3x-inverter using the same side-to-side finFET block layout as used in FIG. 6, with three horizontal fins in each block. The pull-up transistors in the p-channel block are laid out using fins 804, 806, 808, each having a drain terminal coupled to a metal-0 conductor 820 and a source terminal coupled to metal-0 conductor 822. The metal-0 conductor 820 is connected to a metal 2 conductor 830, at which the output signal of the inverter is supplied. The metal-0 conductor 822 is connected to the metal-0 conductor 824, which is in turn coupled to a VDD power conductor. The pull-down transistors in the n-channel block are laid out using single fins 805, 807, 809, each having a drain terminal coupled to the metal-0 conductor 820, and a source terminal coupled to the metal-0 conductor 823. The metal-0 conductor 823 is connected to the metal-0 conductor 825, which is in turn coupled to a VSS power conductor. The patterned gate connector layer includes gate conductor 810 which extends across fins 804, 806, 808 in the p-channel block, and across the fins 805, 807, 809 in the n-channel block. The gate conductor 810 which extends across the p-channel block and the n-channel block in this layout, is connected to a metal-1 connector 831, at which the input to the inverter is supplied. Gate conductors 812 and 814 are "dummy gates." Because of the use of the metal-0 conductors 822, 823 and 820, the pitch associated with these gate conductors is included in the area for the grid cells.

In this example, the total area for the layout of a 3x-inverter using side-to-side blocks, in which the fins of the standard block are fully deployed, includes eight vertical contact pitches and three horizontal contact pitches. The total area is therefore 8 by 3 contact pitches, or $24\lambda^2$, or 24 grid cells.

Figure 9:
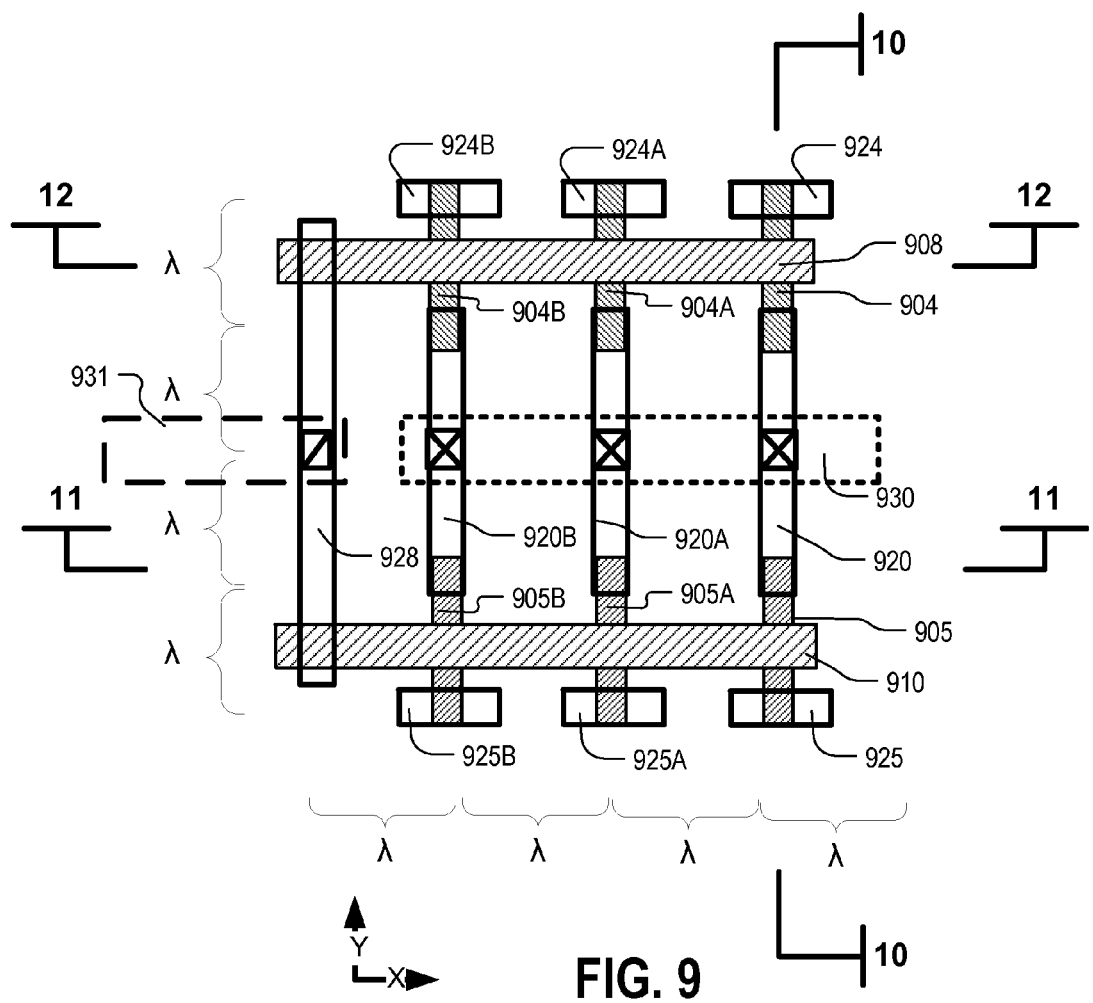
FIG. 9 is a layout diagram of a 3x inverter laid out on end-to-end finFET blocks.

FIG. 9 illustrates a 3x-inverter layout in an end-to-end finFET block, in contrast to the side-to-side layout of FIG. 8. The pull-up transistors in the p-channel block are laid out using fins 904, 904A, 904B, each having a source terminal coupled to the corresponding metal-0 conductor 924, 924A, 924B, and a drain terminal coupled to the corresponding metal-0 conductor 920, 920A, 920B. The metal-0 conductor 920, 920A, 920B are connected to a metal 2 conductor 930, at which the output signal of the inverter is supplied. The metal-0 conductor 924, 924A, 924B are connected to a VDD power conductor, which can be routed through other patterned conductor layers. The pull-down transistor in the n-channel block is laid out using the fins 905, 905A, 905B, each having a drain terminal coupled to the corresponding metal-0 conductor 920, 920A, 920B and a source terminal coupled to the corresponding metal-0 conductor 925, 925A, 925B. The metal-0 conductors 925, 925A, 925B are connected to a VSS power conductor. The patterned gate connector layer includes gate conductor 908 in the p-channel block, and a gate conductor 910 in the n-channel block. The gate conductor 908 and the gate conductor 910 are arranged in parallel. Gate conductor 908 crosses over the fins 904, 904A, 904B in the p-channel block. Gate conductor 910 crosses over the fins 905, 905A, 905B in the n-channel block. The metal-0 conductor 928 is connected from the gate conductor 908 to the gate conductor 910. The metal-0 conductor 928 is connected to a metal-1 conductor 931, at which the input to the inverter is applied.

The 3x-inverter shown in FIG. 9 is laid out using end-to-end finFET blocks, which requires a much smaller area than that of the inverter of FIG. 8 laid out using side-to-side finFET blocks. As illustrated, the inverter of FIG. 9 includes four contact pitches in the vertical direction and four contact pitches in the horizontal direction, for a total area of 4×4 contact pitches, or $16\lambda^2$. This example shows that the end-to-end finFET block layout can be used to implement 3x-inverters using two-thirds of the layout area of a side-to-side finFET block layout, based on three parallel side-by-side fins in each block. The area savings achieved using end-to-end finFET blocks instead of side-to-side finFET blocks depends on the particular cell being formed, and is likely to diminish as the cell sizes increase. For inverters, the savings in area is a function of the number of fins used, the number of fins for which area is allocated in the side-to-side block being compared to the end-to-end block, and the number of gate conductors for which area is allocated in the end-to-end layout. In the layout of smaller cells, such as the 1x-inverter of FIG. 7, end-to-end architectures can be implemented with a greater area savings than can be gained for some larger cells. Thus, it is expected that the technology can be used to implement a given circuit, where there are a significant number of small cells in as little as half the area of that needed for side-to-side embodiments. These savings in area are achieved while also improving the mechanical stability of the fins, and reducing undesirable stress proximity effects.

FIG. 7 and FIG. 9 illustrate a grid layout for structures that can be used to specify functional cells in a finFET functional cell library. The grid layout has grid cells which provide area allocated for the layout for features of the finFET transistors to be used in implementations of functional cells. The size of a grid cell can be based on the horizontal and vertical contact pitches as mentioned above, or on the sizes of other features to be used in the transistors A grid cell therefore is a unit of area in a layout for features of a finFET block as described herein. A functional cell on the other hand, as described herein is a circuit that can include finFETs, stored in a functional cell library that can be implemented using the finFET blocks.

Referring to FIG. 9, a first block includes a first set of semiconductor fins (904, 904A, 904B) arranged on a grid pattern having first and second axes (i.e. Y-axis and X-axis), the semiconductor fins in the first set being aligned parallel with the Y-axis of the grid, and have a X-axis pitch. A second block including a second set of semiconductor fins (905, 905A, 905B) arranged on the grid pattern, the fins in the second set of fins being aligned parallel with the Y-axis of the grid, and having the X-axis pitch. As mentioned above, both the Y-axis and X-axis pitches are labeled X on the Figures, but can have different sizes in some implementations. A patterned gate conductor layer includes gate conductors crossing fins in the first and second sets of fins, the gate conductors disposed on a line parallel with the X-axis of the grid. A plurality of patterned conductor layers (metal-0, metal-1, metal 2), include one or more conductive conductors. A plurality of interlayer connectors includes conductors arranged to connect semiconductor fins, gate elements, and conductors in the plurality of patterned conductor layers. Grid cells on the grid pattern have a Y-axis pitch and a X-axis pitch. The sizes of the Y-axis and X-axis pitches provide at least the area required by the interlayer connectors, and otherwise provide area required a feature of the finFET structure that limits the grid cell size. The semiconductor fins in the first and second sets are spaced along the X-axis by the X-axis pitch. The semiconductor fins in the first and second sets have lengths that are about the same as the Y-axis pitch in this layout architecture.

Also, the inter-block isolation structure (not shown), has a width that is the same as the Y-axis pitch in this example. In other embodiments, the inter-block isolation structure can have a width that is an integer multiple of the Y-axis pitch, or can have a width that is a non-integer multiple of the Y-axis pitch.

Figure 10:
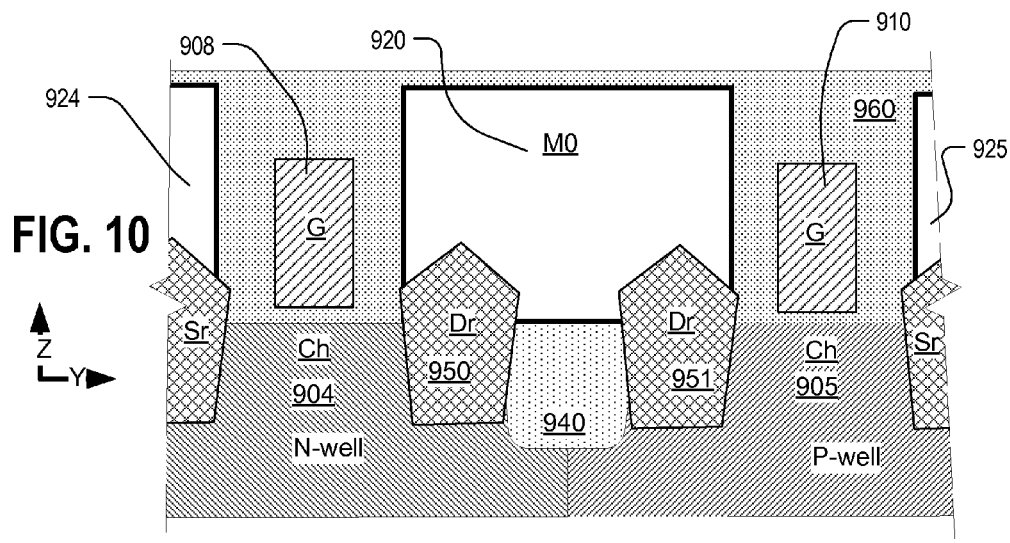
FIGS. 10-12 are cross-section diagrams taken from the layout of FIG. 9.
Figure 11:
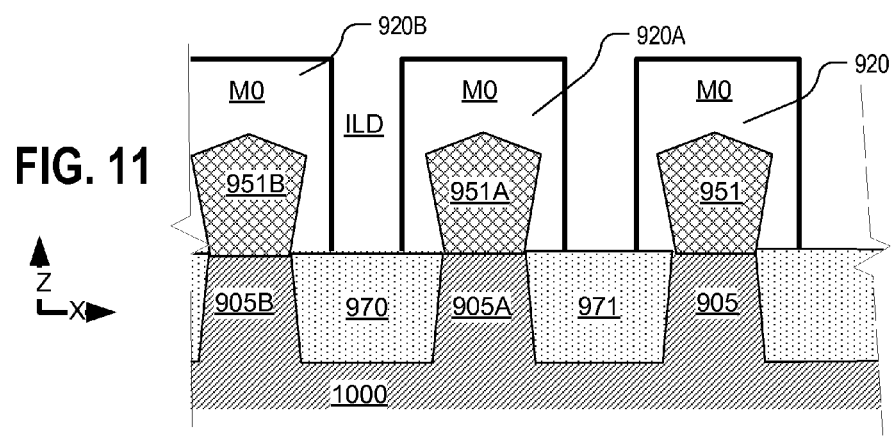
Figure 12:
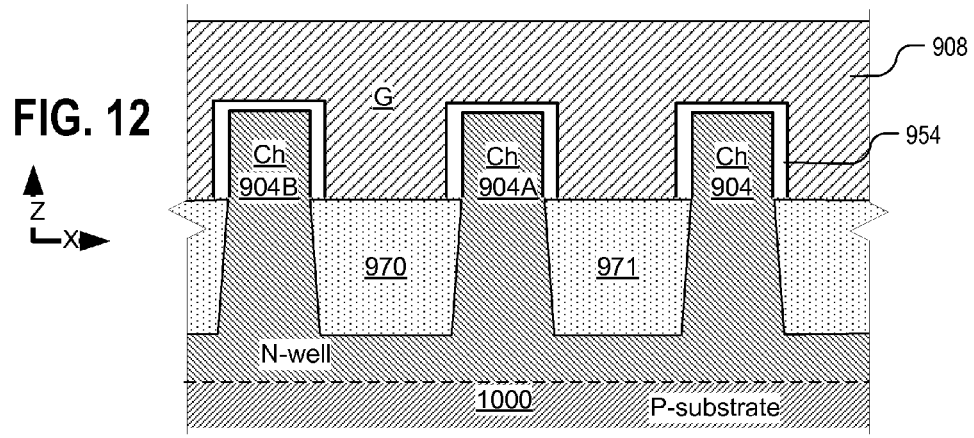

FIG. 9 includes cross-section indicator 10-10 indicating a vertical line of cross-section through the fins 904, 905 which is shown in FIG. 10, cross-section indicator 11-11 indicating a horizontal line of cross-section across the fins 905, 905A, 905B through the drain terminals of the transistors in the n-channel block which is shown in FIG. 11, and cross-section indicator 12-12 indicating a horizontal line of cross-section along the gate conductor 908 in the p-channel block which is shown in FIG. 12.

FIG. 10 illustrates in a simplified cross-section, the first fin 904 in the p-channel block, and the second fin 905 in the n-channel block from the layout of FIG. 9, where the fin 904 and the fin 905 are arranged end-to-end. An isolation structure 940, which comprises an insulator filled trench separates fin 904 from fin 905. The gate conductors 908 and 910 overlie the channel regions on the fins 904, 905, with gate dielectric layers separating them from the fins. Metal-0 conductor 920 is connected from the drain that includes stressor structure 950 on the fin 904, to the drain that includes stressor structure 951 on the fin 905. For the purposes of this description, the source and drain terminals of the finFETs can be referred to as "source/drain regions," as their role as source or drain can depend on the configuration of the functional cell, rather than on their position on the finFET structure. A stressor structure 950 is incorporated into the fin 904, and induces stress in the channel region of the transistor. The stressor structure 950 for a p-channel finFET can be a lattice mismatch structure, such as an epitaxially grown silicon-germanium crystal with p-type doping to form a drain. The stressor structure 951 for an n-channel finFET can be a lattice mismatch structure, such as an epitaxially grown silicon-carbon crystal with n-type doping to form a drain. An insulating fill 960 is illustrated, which covers the fins, the gate conductors 908 and 910, and the metal-0 conductor 920. Metal-0 conductors 924 and 925 are illustrated on the edge of the cross-section, coupled to stressor structures formed on the source terminals of the fins, which likewise induce stress in the channel region.

FIG. 11 illustrates in a simplified cross-section, the structure of the fins in the drain regions of the n-channel block. As illustrated, the fins 905, 905A and 905B have stressor structures 951, 951A, 951B in the drain regions, which can be formed in a recessed portion of the fins 905, 905A, 905B. Shallow trench isolation structures 970, 971 separate the fins. Metal-0 conductors 920, 920A and 920B overlie and contact the drain regions, including the stressor structures. The fins 905, 905A, 905B in this example protrude from a p-type substrate 1000. N-type doping is applied in the drain regions to form n-channel devices in the n-channel block.

FIG. 12 illustrates in a simplified cross-section, the structure of the fins beneath the gate conductor 908 in the p-channel block. As illustrated, the fins 904, 904A and 904B are formed in and protruded from an n-type well in the p-type substrate 1000. Shallow trench isolation structures 970, 971 separate the fins. A gate dielectric layer 954 overlies the sides and the tops of the fins above the top surfaces of the shallow trench isolation structures. The gate conductor 908 wraps around the sides and the tops of the fins to form the finFET transistor structure.

Figure 13:
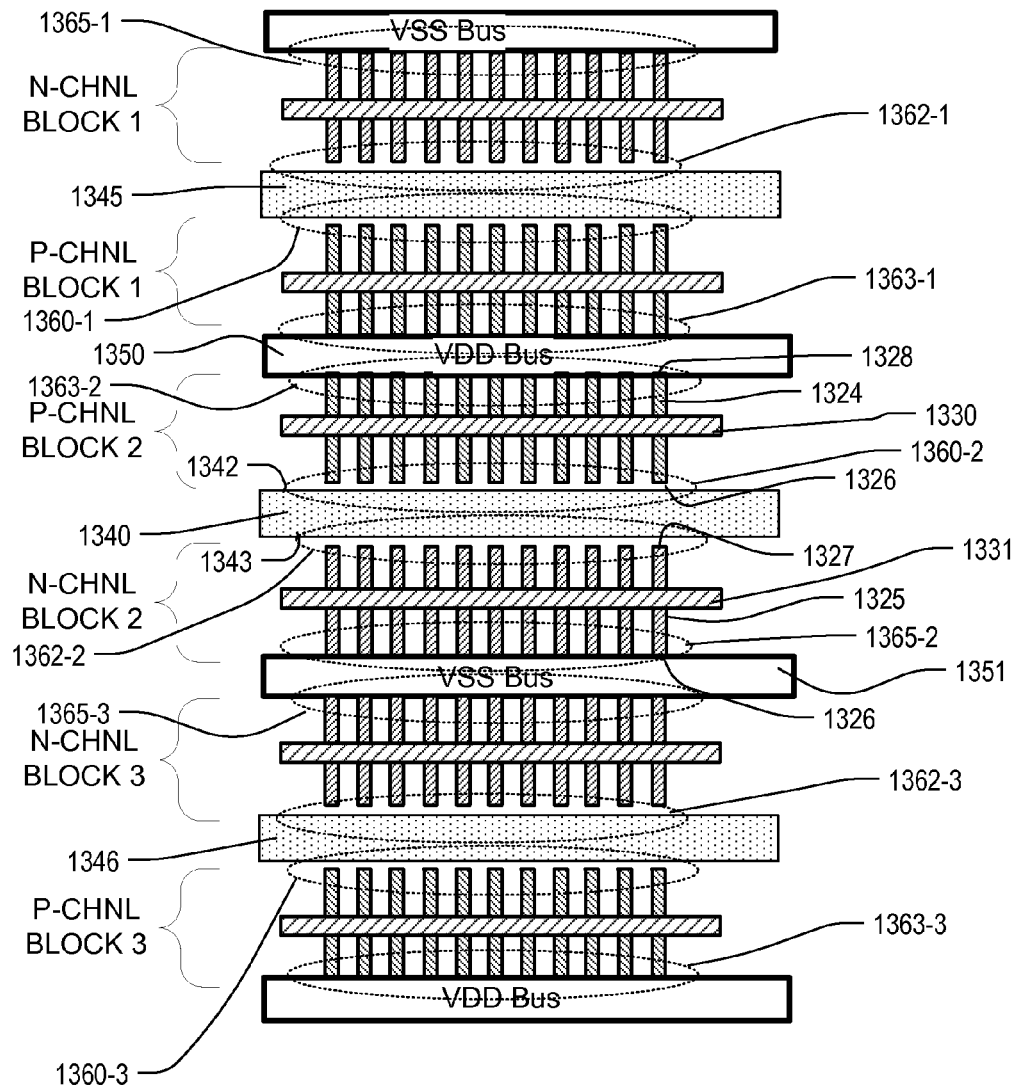
FIG. 13 is a simplified layout diagram of complementary, end-to-end finFET blocks arranged in a mirror image pattern, suitable for use in the standard functional cell library.

FIG. 13 illustrates an embodiment of a finFET array based on an end-to-end layout architecture with a one-transistor configuration, in which the fins have lengths configured for only one finFET transistor each. The lengths of the fins arranged for one transistor each can be configured on a layout grid for one source region, one channel region, and one drain region each. The layout grid for sets of fins in this one-transistor configuration can be set up to allow for only one gate conductor crossing each fin, and for two contacts, such as one metal-0 contact in each of the source and drain regions. This can result, referring to FIG. 7 for example, in a finFET block that has a vertical block pitch that is equal to twice the contact pitch λ. So, the one-transistor configuration of the end-to-end architecture can fit in a layout grid with vertical block pitch of 2λ, assuming that the inter-block isolation structure can be implemented within a single contact pitch.

In some embodiments of a one-transistor configuration of the end-to-end architecture, the structure of the finFET transistors throughout the array can be very uniform. As result, the performance of the finFET transistors is more uniform, so that a circuit design relying on the architecture can have reduced variation among the devices on the integrated circuit.

The layout in FIG. 13 illustrates a repeatable pattern of end-to-end finFET blocks arranged in mirror image so as to share the pitch associated with the contacts for power conductors or power connections to the fins, supporting high density layout of library cells.

The pattern in FIG. 13 includes in sequence on the layout n-channel block 1, p-channel block 1, p-channel block 2, n-channel block 2, n-channel block 3, and p-channel block 3. Inter-block isolation structures are formed between the n-channel block 1 and the p-channel block 1, between the p-channel block 2 and the n-channel block 2, and between the n-channel block 3 and the p-channel block 3. Power connectors for VSS are laid out on the top of the n-channel block 1, and between the n-channel block 2 and the n-channel block 3. Power conductors for VDD are laid out between the p-channel block 1 and the p-channel block 2, and on the end of the p-channel block 3. The pattern can be repeated vertically and horizontally, over an extensive layout grid for synthesis of an integrated circuit.

P-channel block 2 and n-channel block 2, and isolation structure 1340 are referred to for the purposes of describing some of the uniform structures in the layout. Isolation structure 1340 has opposing first and second sides 1342, 1343, and separates the p-channel block 2 and the n-channel block 2. P-channel block 2 includes a set of fins, including fin 1324, the members of which are laid out in parallel on the substrate. The set of fins in p-channel block 2 have proximal ends (e.g. end 1326 on fin 1324) adjacent the first side 1342 of the isolation structure 1340. The fins in the set of fins in the p-channel block 2 (e.g. end 1328 on fin 1324) are in contact with the metal-0 VDD power conductor 1350 in this example, or with another contact structure, and extend through the adjacent p-channel block 1.

N-channel block 2 includes a set of fins, including fin 1325, the members of which are laid out in parallel on the substrate. The set of fins in n-channel block 2 have proximal ends (e.g. end 1327 on fin 1325) adjacent the second side 1343 of the isolation structure 1340. The fins in the set of fins in the n-channel block 2 (e.g. end 1326 on fin 1325) are in contact with the metal-0 VSS power conductor 1351 in this example, or with another contact structure, and extend through the adjacent n-channel block 3.

As described above, the source and drain regions on the fins in both of the p-channel block 2 and the n-channel block 2, can include stressors (not shown in FIG. 13), like lattice mismatched epitaxially grown semiconductor elements, that induce stress in the channel regions of the finFETs.

In the configuration of FIG. 13, the p-channel block 2 includes a set of fins in which all of the p-channel finFET transistors have a uniform structure. As a result of the uniform structure, the dimensions of the finFETs and supporting circuits within the block can have the same sizes within reasonable manufacturing tolerances. Likewise, the n-channel block 2 includes a set of fins in which all of the n-channel finFET transistors have a uniform structure. So, for example, all of the fins in the in the set of fins in the p-channel block 2 can have in uniform a structure like that shown in FIG. 10, including uniform stressor designs on each end, uniform metal contact designs on the source and drain, a single gate conductor between the stressors, the same distance between the contacts on the source and drain, the same fin width and fin height, and a uniform inter-block isolation structure design. As a result of the uniform structure, the finFETs have the same designs and same sizes, and the finFETs in the block can have dynamic characteristics such as stress induced in the channel, with a very tight range of variation across the block.

Thus, FIG. 13 shows an example of a structure wherein the members of a first set of semiconductor fins (p-channel block 2) have lengths configured for formation of a single finFET in each block. In this example, each semiconductor fin extends across two blocks of the same type (e.g., p-channel block 1 through p-channel block 2, and n-channel block 2 through n-channel block 3). One end of a semiconductor fin (e.g. 1324) that extends across p-channel block 2 and p-channel block 1 is adjacent to the inter-block isolation structure 1340, while the other end is adjacent to the inter-block isolation structure 1345. In this configuration, the finFETs in each p-channel block (e.g., p-channel block 2) include first uniform structures (in region 1360-2) between inter-block isolation structure 1340 and the first gate conductor 1330 and second uniform structures (in region 1363-2) between the VDD power conductor 1350 (or other metal-0 structure) and the gate conductor 1330. The finFETs in p-channel block 1 also have uniform structures, arranged in mirror image layout to those of p-channel block 2. One end of a semiconductor fin (e.g. 1325) that extends across n-channel block 2 and n-channel block 3 is adjacent to the inter-block isolation structure 1340, while the other end is adjacent to the inter-block isolation structure 1346. In this configuration, the finFETs in each re-channel block (e.g., n-channel block 2) include third uniform structures (in region 1362-2) between inter-block isolation structure 1340 and the second gate conductor 1331 and fourth uniform structures (in region 1365-2) between the VSS power conductor 1351 (or other metal-0 structure) and the second gate conductor 1331. As mentioned above, the first, second, third and fourth uniform structures can include stressors.

The structures in p-channel block 2 and in n-channel block 2 can be copied in a plurality of other blocks arranged as shown in FIG. 13. Thus, the structures between the ends of the fins and the corresponding gate conductors in the regions 1360-1 and 1360-3 can be uniform with the structures in region 1360-2, though those in region 1360-2 are laid out in mirror image with those in regions 1360-1 and 1360-3. Likewise the structures between the corresponding metal-0 power conductors and the corresponding gate conductors in regions 1363-1 and 1363-3 can be uniform with the structures in region 1363-2. The structures in regions 1362-1 and 1362-3 can be uniform with the structures in region 1362-2. The structures in regions 1365-1 and 1365-3 can be uniform with the structures in region 1365-2.

In FIG. 13, the p-channel blocks and the n-channel blocks are configured for a single finFET on each semiconductor fin between the power conductor and the inter-block isolation structure. In other embodiments, the p-channel blocks and the n-channel blocks are configured for more than one finFET on each semiconductor fin between the power conductor and the inter-block isolation structure, while preserving the advantages achieved from the uniformity of the structures across the layout. In some embodiments having more than two gate elements on a given fin between inter-block isolation structures, the power conductor coupled to a particular finFET on a given fin can be located anywhere along the fin, using interlayer connectors to connect vertically to a patterned metal conductor, for example that acts as a power conductor or as a connection to a power conductor located elsewhere on the layout. The single finFET configuration can result in efficiencies in the implementation of library cells that conserve space, particularly for smaller library cells. In some implementations, single finFET blocks and multiple finFET blocks can be disposed on a single integrated circuit. Also, in some implementations combinations of end-to-end finFET blocks, and side-by-side finFET blocks can be disposed on a single integrated circuit.

Figure 14:
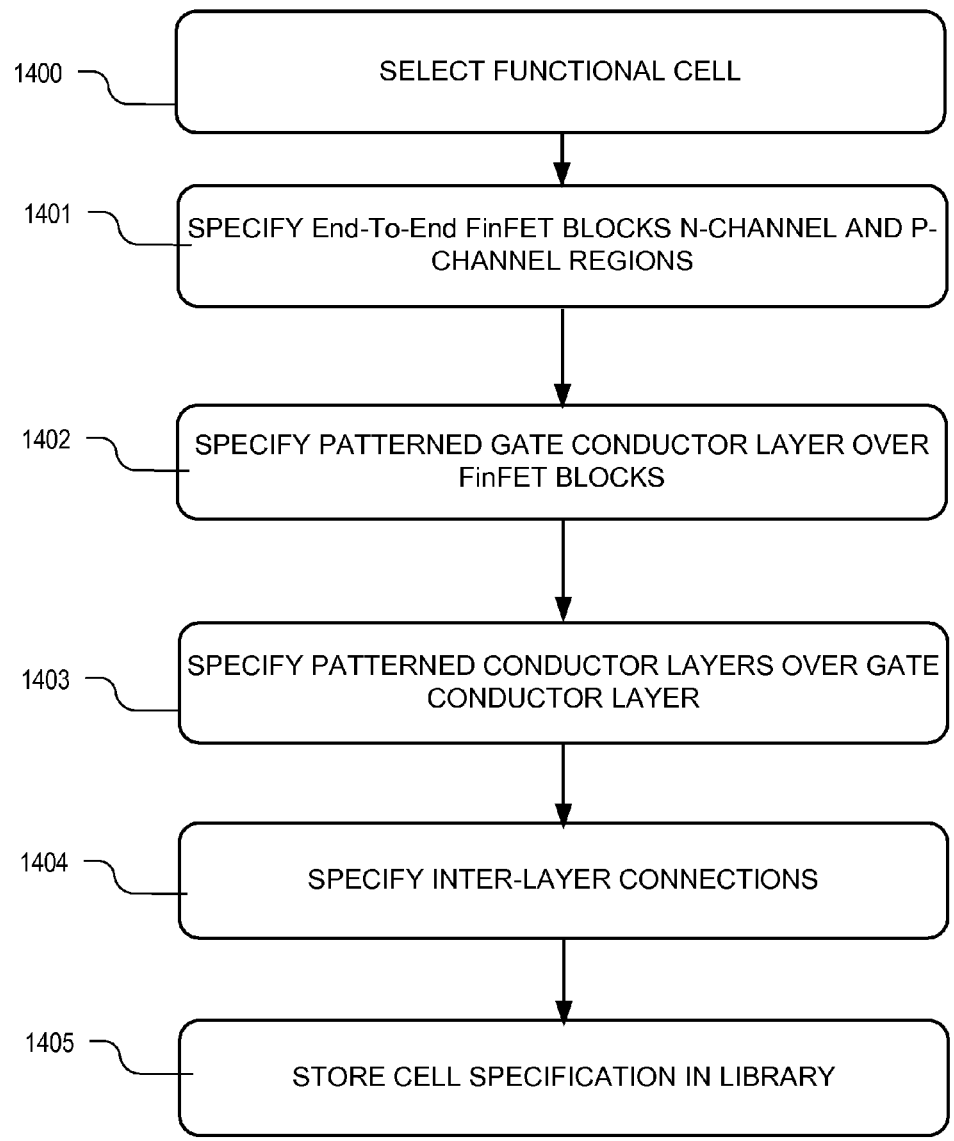
FIG. 14 is a simplified flow diagram of a process for manufacturing a functional cell library including designing an end-to-end finFET block-based functional cell for the functional cell library.

FIG. 14 is a simplified flow diagram of a process for designing a finFET block-based cell for a cell library. The method may be performed, for example, by an interactive software tool that is used by a cell designer to create a library of cells. The order of the steps can be modified as suits a particular design. According to the simplified flow diagram, a functional cell to be included in a cell library is selected (1400). Such a cell can be an inverter as described above, a flip-flop, logic gates, logic blocks or other cell structures. Next, finFET blocks are specified, including end-to-end blocks, and optionally side-to-side blocks, assuming CMOS technology, for n-channel and p-channel devices (1401). User input may specify the shape and location of objects in the cell (e.g., cell boundary, location and width of power conductors, gates, active areas) and so on. For end-to-end blocks, the fins can be considered to be arranged in columns. Then, the patterned gate conductor layer is specified, to form gates in rows overlying the fins that will be used in the cell (1402). Then, the patterned conductor layers are specified, to establish appropriate interconnections, preferably including a layer having conductors arranged in columns, and a layer having conductors arranged in rows (1403). The plurality of patterned conductor layers includes power conductors. Then the interlayer connections are specified, to locate connections among the fins, the gate conductors and the conductors in the one or more patterned conductor layers (1404). The specifications produced in this method comprise layout files implemented in a GDS II format database file representing the specified planar shapes of the elements, or other computer readable format. The specified cells are then stored in a cell library for use in integrated circuit design (1405). The process may be repeated to generate a cell library that includes a large number of standard cells implementing different functions.

Figure 15:
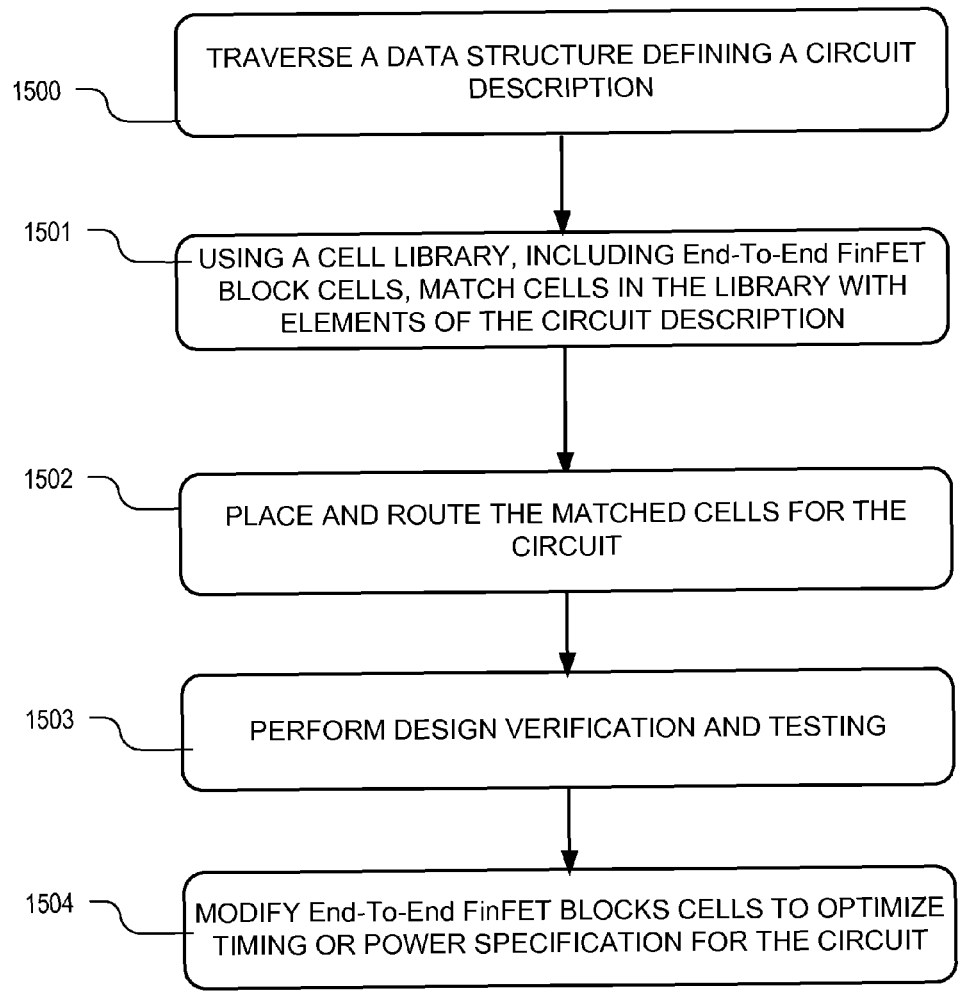
FIG. 15 is a simplified flow diagram for an automated design process utilizing a liquid functional cell library including end-to-end finFET block-based functional cells as described herein.

FIG. 15 is a flowchart for a representative design automation process which can be implemented as logic executed by a system like that represented by FIG. 2, including a finFET block library having cells implemented using at least one end-to-end finFET block as described herein. According to a first step of the process, a data structure that defines a circuit description, such as a netlist, is traversed in data processing system (1500). A cell library stored in a database or other computer readable medium coupled with the data processing system, that includes end-to-end finFET block-based cells as described herein, is accessed by the data processing system, and utilized to match cells in the library with the elements of the circuit description (1501). The matched cells are then placed and routed for an integrated circuit layout (1502). Next, design verification and testing is executed (1503). Finally, end-to-end finFET block cells can be modified to optimize timing or power specifications for the circuit (1504). The modifications of the finFET block cells can comprise mask changes that result in changes to the conductors in the patterned conductor layers, and in the pattern of interlayer connectors, to change the number of fins utilized in a particular transistor. These changes can be accomplished in some instances without changing the area on the integrated circuit occupied by the block in which the cell is located.

A finFET block architecture described above can be utilized to create a flexible library that comprises a plurality of end-to-end finFET block-based cells.

The problem of bent or warped fins can be avoided using isolation structures as described herein.

The finFET blocks described herein can be arranged in a repeating pattern of n-channel blocks and p-channel blocks, allowing for flexible implementation of CMOS circuit elements utilizing complementary portions in blocks above and below a particular block, where at least a central block includes a plurality of power conductors overlying the block.

The finFET block architecture described herein allows for very dense area utilization with flexible layout strategies. The technology can be suited for implementation of gate arrays, field programmable gate arrays, "sea of gates" architectures and other high density and/or high performance integrated circuit structures.

The flexible layout in orthogonal pattern structures makes the end-to-end finFET blocks described herein ideal for implementing engineering change orders for size changes, or other modifications, during design verification processes during integrated circuit design and manufacturing.

The finFET block architecture described herein can be implemented with mixed block heights and block widths, so that variable sized blocks can be utilized, as suits the needs of a particular design goal.

In general, the creation of a finFET block-based flexible library is enabled using the finFET block architecture described herein. In such library, the standard cells can consist of "soft macros" that could be populated with some flexibility as to the exact location of their underlying elements. Unlike planar CMOS structures, where the granularity for modifications or adjustments of the cells is the whole transistor, in finFET block architectures as described herein, the granularity can be the fin. Designing finFET block structures using a subset of the fins arranged in parallel in a block provides for design flexibility.

A library can be comprised of a plurality of finFET block-based functional cells which exploit subsets of the available fins in the finFET blocks, leaving room for optimization procedures that do not alter the area of the layout. The library can be designed applying a minimum granularity to a single fin in the block for a gate conductor along a column traversing a block of horizontal fins, rather than all of the fins in the block.

The end-to-end finFET block layout described herein takes advantage of the quantized gate width of the finFET library block, while substantially reducing transistor performance variation effects from the proximity of asymmetric structures and substantially reducing the problems with mechanical stability that arise as the dimensions shrink. The end-to-end finFET block layout allows formation of narrower fins, thereby reducing off-state leakage of the transistors. In addition, end-to-end finFET block layouts can reduce chip area consumed by the circuitry implemented using the blocks by amounts on the order of one-half.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A data processing system adapted to process a computer implemented representation of a circuit design, comprising:
   a data processor and memory coupled to the data processor, the memory storing instructions executable by the data processor, including instructions to match cells specified in a machine readable circuit description with cells in a cell library, the cell library including a plurality of cells having a base structure comprising:
   a first block including a first set of semiconductor fins aligned in a first direction;
   a second block including a second set of semiconductor fins aligned in the first direction;
   an inter-block isolation structure in a third region having a first side adjacent to the first block and a second side adjacent to the second block, wherein semiconductor fins in the first set extend away from the inter-block isolation structure, have ends proximal to the first side of the inter-block isolation structure and have ends distal to the inter-block isolation structure, and wherein semiconductor fins in the second set extend away from the inter-block isolation structure, have ends proximal to the second side of the inter-block isolation structure and have ends distal to the inter-block isolation structure;
   cells in the plurality of cells including:
   a patterned gate conductor layer on the base structure including a first gate conductor extending across at least one fin in the first set of semiconductor fins, and a second gate conductor extending across at least one fin in the second set of semiconductor fins;
   a plurality of patterned conductor layers on the base structure, one or more conductive conductors in the plurality of patterned conductor layers being arranged to connect a semiconductor fin in the first set to a semiconductor fin in the second set, arranged to connect the first gate conductor to the second gate conductor, and arranged to connect a power conductor to at least one semiconductor fin in one of the first and second sets; and
   a plurality of interlayer connectors on the base structure that connect semiconductor fins, gate conductors, and conductors in the plurality of patterned conductor layers.

2. The system of claim 1, wherein semiconductor fins in the second set are aligned end-to-end with semiconductor fins in the first set.

3. The system of claim 1, including:
   at least one patterned conductor layer in the plurality of patterned conductor layers, including an inter-block conductor parallel, and adjacent to, one of the semiconductor fins in the first set and one of the semiconductor fins in the second set, the inter-block conductor connecting the first gate conductor to the second gate conductor.

4. The system of claim 1, including:
   at least one patterned conductor layer, including an inter-block conductor arranged to connect a first semiconductor fin in the first set to a second semiconductor fin in the second set, wherein the second semiconductor fin is aligned end-to-end with first semiconductor fin.

5. The system of claim 1, wherein the first and second sets of fins include transistor channels, sources and drains, and including stressor structures on the sources and drains.

6. The system of claim 1, wherein the end proximal to the first side of the inter-block isolation structure on at least one fin in the first set of semiconductor fins includes a stressor structure either on said end or between said end and the first gate conductor.

7. The system of claim 1, wherein the end proximal to the first side of the inter-block isolation structure on at least one fin in the first set of semiconductor fins includes a first stressor structure either on said end or between said end and the first gate conductor; and the end proximal to the second side of the inter-block isolation structure on at least one fin in the second set of semiconductor fins includes a second stressor structure either on said end or between said end and the second gate conductor.

8. The system of claim 1, including power connectors coupled with the first and second sets of semiconductor fins.

9. The system of claim 1, wherein the semiconductor fins in the first and second sets have widths less than 20 nm.

10. The system of claim 1, wherein the members of the first set of semiconductor fins are configured for formation of a single finFET, with a first source/drain region adjacent to the inter-block isolation structure and a second source/drain region, and include first uniform structures including their first source/drain region and second uniform structures including their second source/drain regions.

11. The system of claim 10, wherein the members of the second set of semiconductor fins are configured for formation of a single finFET, with a first source/drain region adjacent to the inter-block isolation structure and a second source/drain region, and include third uniform structures including their first source/drain region and fourth uniform structures including their second source/drain regions.

12. The system of claim 11, wherein the first, second, third and fourth uniform structures include stressors.

13. The system of claim 1, wherein the members of the first set of semiconductor fins are configured for formation of multiple finFETs each.

* * * * *